United States Patent
Bedjaoui et al.

(10) Patent No.: US 9,781,833 B2
(45) Date of Patent: Oct. 3, 2017

(54) METHOD OF MAKING A MICROELECTRONIC DEVICE

(71) Applicant: Commissariat A L'Energie Atomique et aux Energies Alternatives, Paris (FR)

(72) Inventors: Messaoud Bedjaoui, Voreppe (FR); Raphael Salot, Lans-en-Vercors (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 0 days.

(21) Appl. No.: 15/293,859

(22) Filed: Oct. 14, 2016

(65) Prior Publication Data

US 2017/0111994 A1    Apr. 20, 2017

(30) Foreign Application Priority Data

Oct. 15, 2015 (FR) ..................... 15 59794

(51) Int. Cl.
H01L 21/00 (2006.01)
H05K 1/18 (2006.01)
(Continued)

(52) U.S. Cl.
CPC .......... *H05K 1/18* (2013.01); *H01L 31/0203* (2013.01); *H01L 51/5253* (2013.01);
(Continued)

(58) Field of Classification Search
CPC .... H05K 3/4038; H05K 5/03; H05K 2201/20; H05K 3/284
(Continued)

(56) References Cited

U.S. PATENT DOCUMENTS 6,238,951 B1    5/2001    Caillat
2004/0010910 A1    1/2004    Farrell et al.
(Continued)

FOREIGN PATENT DOCUMENTS

EP    1 557 394 A1    7/2005
FR    2 987 173 A1    8/2013
WO    WO 2008/036731 A2    3/2008

OTHER PUBLICATIONS

French Preliminary Search Report issued Aug. 19, 2016 in French Application 15 59794, filed on Oct. 15, 2015 ( with English Translation of Categories of Cited Documents and Written opinion).

(Continued)

*Primary Examiner* — Sherman Ng
(74) *Attorney, Agent, or Firm* — Oblon, McClelland, Maier & Neustadt, L.L.P.

(57) ABSTRACT

This invention relates to a method for producing an electrical system comprising a support (1) bearing on a first face at least one device; with the device comprising at least one electronic component (2) provided with at least one electrical connector (21, 22), with the method comprising: a step of setting in place of a cover (6) positioned above the component; said cover (6) comprising at least one passage (61, 62) according to a dimension in thickness of the cover (6) in such a way as to form an access space to the at least one electrical connector (21, 22), a step of forming a sealing seam (71) in such a way that the component is encapsulated in a sealed cavity (9) delimited by the first face of the support (1), the first face of the cover (6) and the sealing seam (7). The method comprises a step of filling with a conductive material of is at least one passage (61, 62) of the cover (6) in such a way as to establish an electrical continuity between the conductive material and the at least one electrical (Continued)

connector (21, 22), formant a tapping (81, 82) and in that the sealing seam (7) comprises a dielectric material.

25 Claims, 6 Drawing Sheets

(51) Int. Cl.
    *H01L 51/52*      (2006.01)
    *H01L 31/0203*      (2014.01)
    *H05K 3/28*      (2006.01)
    *H05K 1/11*      (2006.01)
    *H05K 5/03*      (2006.01)
    *H05K 5/00*      (2006.01)
    *H05K 3/40*      (2006.01)

(52) U.S. Cl.
    CPC ............. *H05K 1/115* (2013.01); *H05K 3/284* (2013.01); *H05K 3/4038* (2013.01); *H05K 5/0021* (2013.01); *H05K 5/03* (2013.01); *H05K 2201/20* (2013.01)

(58) Field of Classification Search
    USPC ........................................ 438/106, 124, 125
    See application file for complete search history.

(56) References Cited

U.S. PATENT DOCUMENTS

| | | |
|---|---|---|
| 2004/0012083 A1 | 1/2004 | Farrell et al. |
| 2005/0189332 A1 | 9/2005 | Farrell et al. |
| 2005/0250253 A1* | 11/2005 | Cheung ............... B81C 1/00293 438/125 |
| 2005/0260797 A1 | 11/2005 | Farrell et al. |
| 2006/0063462 A1 | 3/2006 | Ding et al. |
| 2006/0108675 A1* | 5/2006 | Colgan ............... B81C 1/00293 257/684 |
| 2006/0216589 A1 | 9/2006 | Krasnov et al. |
| 2007/0218585 A1* | 9/2007 | Robert ................ B81C 1/00285 438/106 |
| 2010/0003789 A1* | 1/2010 | Caplet ................ B81C 1/00285 438/124 |
| 2010/0096712 A1 | 4/2010 | Knechtel |
| 2010/0227214 A1 | 9/2010 | Krasnov et al. |
| 2011/0012248 A1 | 1/2011 | Reichenbach et al. |
| 2012/0104593 A1* | 5/2012 | Kanemoto .......... B81C 1/00333 257/729 |
| 2012/0251867 A1 | 10/2012 | Krasnov et al. |
| 2013/0061674 A1 | 3/2013 | Reichenbach et al. |
| 2013/0216904 A1 | 8/2013 | Jarry |
| 2015/0115376 A1 | 4/2015 | Chen et al. |

OTHER PUBLICATIONS

U.S. Appl. No. 15/291,571, filed Oct. 12, 2016, Messaoud Bedjaoui et al.

Extended European Search Report issued Mar. 13, 2017 in Patent Application No. 16193575.4 (with English Translation of Categories of Cited Documents).

\* cited by examiner

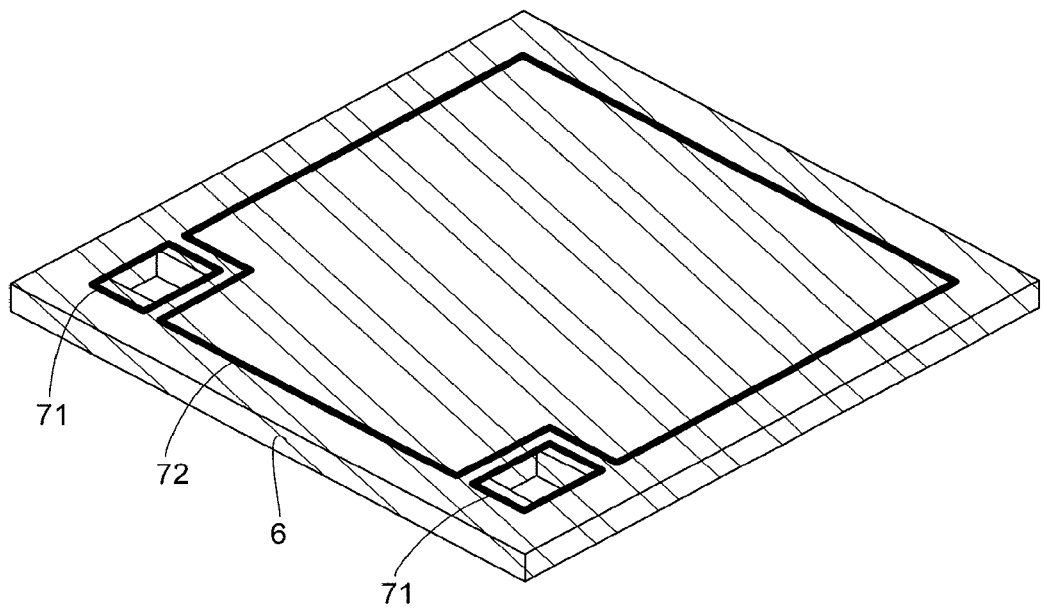
FIG. 4
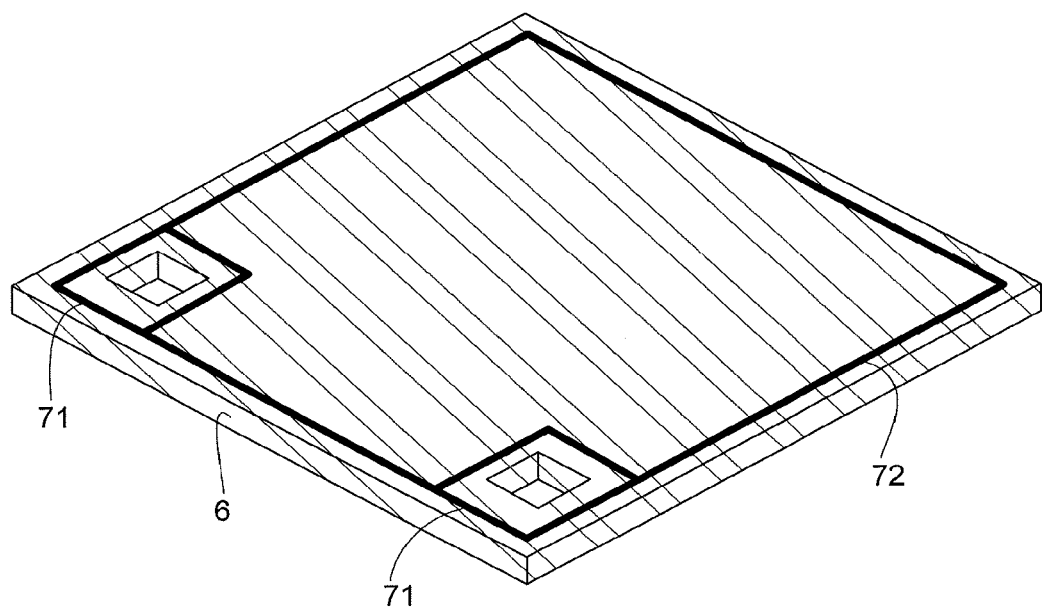
FIG. 4 BIS

METHOD OF MAKING A MICROELECTRONIC DEVICE

FIELD OF THE INVENTION

This invention relates to the encapsulation and the integration of devices in particular microelectronic devices comprising layers that are sensitive to the air. The invention has in particular application in the three-dimensional (3D) assembling of electronic devices with various functionalities (mechanical, optical, optoelectronic, etc.).

TECHNOLOGICAL BACKGROUND

In certain applications, in particular in the field of electronics, there is a need to provide circuits with ever-increasing performance, while taking up less and less space. This need tends to be satisfied by providing devices and electronic circuits based on innovative "packaging" architectures, combined with component stacking and assembling technologies and electrical interconnections. The main motivation results from a construction choice of the "packaging" that aims to achieve maximum electrical performance, accompanied by reduced encumbrance.

Generally, thin layer microelectronic components today still form the bridgehead in the development of electronics. Among the most studied devices, there are systems for storing energy such as micro-batteries with a lithium base, systems for recovering energy such as organic photovoltaic cells and organic photo-detectors or, also, systems for displaying such as organic light-emitting diodes.

The common problem of these circuits and of the active layers that they are comprised of, resides in their rapid degradation in the presence of oxidizing gases of the atmosphere, water and oxygen. These electronic components, for the vast majority, embed encapsulation solutions so as to avert the oxidizing and corrosive elements present in the surrounding atmosphere. With respect to barrier performance, the requirements can vary from one application to another. However, it is frequently admitted that the global level sought is between $10^{-4}$ and $10^{-6}$ g·m$^{-2}$·j$^{-1}$ for the Water Vapor Transmission Rate (WVTR) criterion and between $10^{-4}$ and $10^{-6}$ cm$^{-3}$·m$^{-2}$·j$^{-1}$ for the Oxygen Transmission Rate (OTR) criterion.

The encapsulation solutions described in prior art can be divided into two families: encapsulating product and added case. The term encapsulating product means a sealed barrier system carried out monolithically on the stack of active layers of a microelectronics device. This solution refers to the hybrid multilayer structures that alternate organic thin layers with inorganic thin layers deposited by standard vacuum deposition technologies. The principle of an encapsulation by added case is generally based on the carrying out of a sealed cavity of which the atmosphere is controlled (vacuum, pressure, gas). This encapsulation, referred to as heterogeneous, is considered to be one of the most reliable solutions for meeting the needs of microelectronic devices sensitive to the air. The main motivations for this mode of encapsulation primarily reside in the ease of implementing it, its low cost and its performance (barrier, mechanics, adherence, thermal), in comparison with monolithic encapsulation solutions. In this technology, the encapsulation system can be produced separately before transferring it onto the support containing the active layers forming the microelectronic device. As such, the sealed cavity can be defined, for example, by a cover transferred and sealed onto a substrate containing active layers sensitive to the air. These solutions of transferring the cover adapt perfectly to the requirements of integrating microelectronic devices thanks in particular to their capacity of reducing their dimensions of length, width and thickness.

Whether they are monolithic or heterogeneous, the first function of the encapsulation solutions is to protect the microelectronic device from the external environment. However, these solutions must also offer easy integration via direct access to the input/output pads of the components.

In order to overcome this disadvantage, it has been proposed to use the technologies of "through-vias" machined in one of the substrates as described in EP A1 1557394, most often in the covers in order to access the electrical contacts. However the problem then arises of the seal and hermeticity of the vias constituted in relation to the oxidizing elements. In this case, the vulnerability of the encapsulation solutions via a cover depends exclusively on passages created in the cover or in the receiving substrate. The electrical connection for the purposes of a tapping can also be improved.

An object of this invention is to provide a method for producing and an encapsulation system that at least partially overcomes certain disadvantages of the existing methods.

SUMMARY OF THE INVENTION

An aspect of this invention relates to a method for producing an electrical system comprising at least one device that comprises a support bearing on a first face at least one electronic component provided with at least one electrical connector, with the method comprising:

a step of setting in place of a cover above the component, said cover comprising at least one passage according to a dimension in thickness of the cover in such a way as to form an access to the at least one electrical connector, a step of forming a sealing seam in such a way that the component is at least partially located in a cavity delimited by the Out face of the support, the first face of the cover and the sealing seam.

Advantageously, the method comprises a step of filling with an electrically conductive material of the at least one passage of the cover in such a way as to establish an electrical continuity between the electrically conductive material and the at least one electrical connector, formant a tapping, and the sealing seam is dielectric.

This invention also relates to, in embodiments, an electrical system comprising at least one device that comprises on a first face at least one electronic component provided with at least one electrical connector, with the system comprising:

a cover positioned above the component, said cover comprising at least one passage according to a dimension in thickness of the cover in such a way as to form an access to the at least one electrical connector, a sealing seam in such a way that the component is at least partially located in a cavity delimited by the first face of the support, the first face of the cover and the sealing seam.

Advantageously, it comprises an electrically conductive material that fills the at least one passage of the cover in such a way as to establish an electrical continuity between the electrically conductive material and the at least one electrical connector, formant a tapping and the sealing seam is dielectric.

Advantageously, the sealing seam comprising a first seam in the longitudinal dimension forms a closed contour around the passage. Preferably, this first seam extends only around this passage in such a way as to specifically isolate the inside space from the cavity located next to the passage Advantageously, the connector is arranged in such a way that the projection of the passage according to the thickness of the support intersects only the connector in such a way that the first seam ensures the seal of the portion considered of the connector which is facing the passage relatively to the rest of the electronic component and possibly to the rest of the connector if the first sealing seam isolates only a portion of the latter.

As such, the electrical connection for the tapping on a connector operates without calling the seal into question. The sealing seam produces a wall that makes it possible to insulate the electrically conductive material.

BRIEF INTRODUCTION OF THE FIGURES

Other characteristics, purposes and advantages of this invention shall appear when reading the following detailed description, with regards to the annexed drawings, provided as non-limiting examples, and wherein:

FIG. 4 shows the formation of a sealing seam on a first face of the cover. FIG. 4b is shows an alternative of this as to the shape of the sealing seam.

Figure 1:
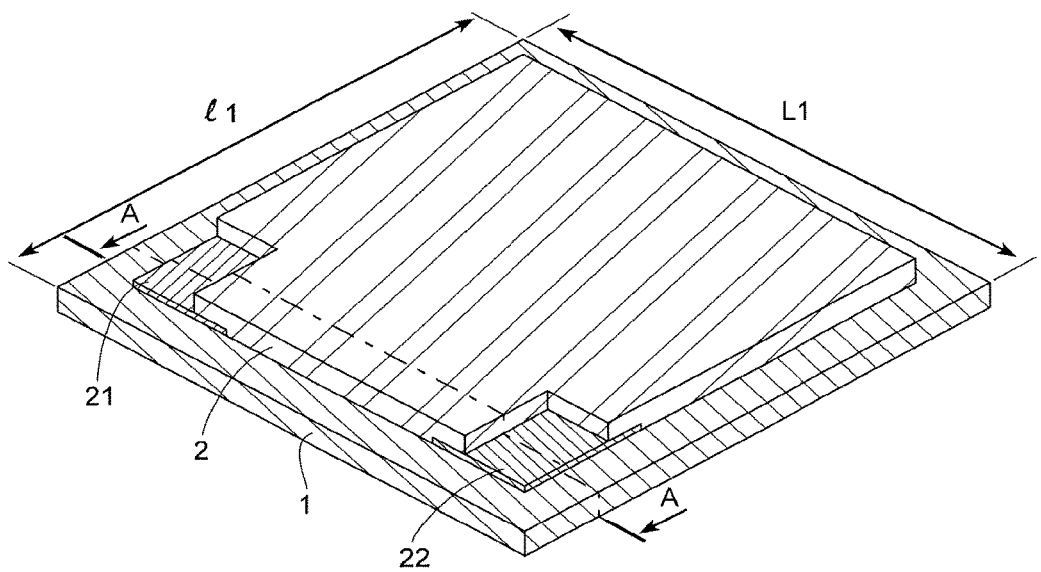
FIG. 1 shows a top view of a component, for example a unit battery, comprising a first electrical connector and a second electrical connector.

The drawings are given as examples and do not limit the invention. They form diagrammatical block diagrams intended to facilitate the understanding of the invention and are not necessarily to the scale of the practical applications. In particular, the relative thicknesses of the various layers and substrates may not be representative of reality.

DETAILED DESCRIPTION

Before beginning a detailed review of the embodiments of the invention, hereinafter are mentioned the optional characteristics that may be used according to any combination or alternatively:

prior to the step of filling with an electrically conductive material, it is carried out in the support (1) the at least one passage (63, 64) according to a dimension in thickness of said support in such a way that the at least one passage (63, 64) passes through the at least one electrical connector (21, 22);

the step of filling is configured in such a way that the conductive material passes through the support (1) through the at least one passage (63, 64) in such a way as to be exposed on a second face of the support (1), opposite the first face.

the connector (21, 22) is positioned at the periphery of the electronic component (2).

the step of setting in place of the cover (6) is configured to preserve at least one second access to at least one second electrical connector (61, 62): said cover (6) comprising at least one second passage (61, 62) according to a dimension in thickness of the cover (6), and the step of filling with a conductive material is carried out in such a way as to fill at least the first passage (61) forming a first tapping (81) with electrical continuity with the first electrical connector (21) and the second passage (62) forming a second tapping (82) with electrical continuity with the second electrical connector (22).

the cover (6) comprises at least one electronic component (2) on at least one of its faces and wherein the at least one passage (61, 62) of the cover (6) passes through the at least one electrical connector (21, 22) of the component in such a way that the step of filling is configured in such a way as to establish an electrical continuity between the at least one electrical connector (21, 22) of an electronic component (2) carried by the support (1) and the at least one electrical connector (21, 22) of the electronic component (2) carried by the cover (6).

several devices are superimposed according to the dimension in thickness, the cover (6) of a first device acting as a support (1) for a second device, in such a way that, during the step of filling, the at least one electrical continuity between them by the conductive material in such a way as to form a tapping (81, 82) of the system common to said devices.

at least one passage (61, 62) of each device is facing a passage (61, 62) of each one of the other devices.

the sealing seam (7) comprises a first seam (71); the first seam (71) forming a closed contour around the at least one passage (61, 62).

the sealing seam (7) comprises a second seam (72); the second seam (72) forming a closed contour or not around at least one portion of the component, with one portion of the at least one electrical connector (21, 22) not being surrounded by said second seam (72). Preferably, one portion of the at least one electrical connector (21, 22) is not surrounded by said second seam (72); preferably, the second seam is used in conjunction with the first seam in such a way that each one of the two seams is specifically dedicated to the isolation of different parts of the electronic component. This does not exclude these two seams from having common parts or from joining together in certain places.

The sealing seam is formed with a deposition of material on a face of the support and/or of the cover;

after the step of setting in place of the cover (6), as the sealing seam is made of a fusible material, a heat treatment of said seam is carried out. The heat treatment can comprise a local treatment for example by laser irradiation of the sealing seam (7) through the cover (6) and/or of the substrate (1), or a global heat treatment of the system. Generally, there can be recourse to local heating; it is also possible to use thermocompression, in particular for components that have low sensitivity to temperature;

the sealing seam is made from a fusible material;

after the step of forming the electronic component (2), a deposition is made of a sealing layer over the entire surface of the first face of the cover (6) and/or of the first face of the substrate (1) and, after the setting in place of the cover (6), a local heat treatment is carried out via laser irradiation of said sealing layer in such a way as to form the sealing seam (7).

the step of setting in place of the cover (6) comprises a step of compressing of the sealing seam (7).

the sealing seam (7) comprises a compressible material of which the elasticity modulus is between 50 and 80 GPa (gigaPascal). This can be glass paste. As a complement or alternatively, the CTE coefficient (coefficient of thermal expansion) of the seam can be between $10^{-7\circ}$ C. and $10^{-5\circ}$ C.;

the support (1) and/or the cover (6) are/is formed from a glass-base and/or transparent material.

the support (1) comprises at least one passage (63, 64) according to a dimension in thickness of said support (1) in such a way that the at least one passage (63, 64) passes through the at least one electrical connector (21, 22).

the conductive material passes through the support (1) through the at least one passage (63, 64) in such a way as to be exposed on a second face of the support (1), opposite the first face.

the connector (21, 22) is positioned at the periphery of the electronic component (2).

the cover (6) comprises at least one electronic component (2) on at least one of its faces and wherein the at least one passage (61, 62) of the cover (6) passes through the at least one electrical connector (21, 22) of the component (2) in such a way as to establish an electrical continuity between the at least one electrical connector (21, 22) of the support (1) and the at least one electrical connector (21, 22) of the cover (6).

The system comprises several devices in superposition according to the dimension in thickness; the cover (6) of a first device forming the support (1) of a second device, with each one of the devices comprising a passage (61, 62) in such a way that, the at least one electrical connector (21, 22) of each one of the devices is placed in electrical continuity by the conductive material formant a tapping (81, 82) of the system common to said devices.

the sealing seam (7) comprises a first seam (71); the first seam (71) forming a contour around all or a portion of the at least one passage (61, 62).

the sealing seam (7) comprises a second seam (72); the second seam (72) forming a closed contour around a portion of the component, with one portion of the at least one electrical connector (21, 22) not being surrounded by said second seam (72).

a sealing layer deposited over the entire surface of the first face of the cover (6) and/or of the first face of the substrate (1), forms partially at least the sealing seam (7).

the step of setting in place of the cover (6) comprises a step of compressing of the sealing seam (7). Moreover the compression can be obtained by mechanical pressurizing of the seam between the cover and the substrate using for example a piston.

the sealing seam (7) comprises a compressible material and can have a glass paste base. The width of the seam can correspond to between 0.5% and 2% (and more preferably to 1%) of the width of the cover in order to rigidify the whole.

The system comprises at least one second access to at least one second electrical connector (21, 22); said cover (6) comprising at least one second passage (61, 62) according to a dimension in thickness of the cover (6), the conductive material filling at least the first passage (61) forming a first tapping (81) with electrical continuity with the first electrical connector (21) and the second passage (62) forming a second tapping (82) with electrical continuity with the second electrical connector (22).

the support (1) and/or the cover (6) are/is formed of a glass-based and/or transparent material.

the at least one component (2) comprises, successively and in order, a first electrode (3) deposited on the support (1), an intermediate layer (4) deposited in contact with at least one portion of the first electrode (3), a second electrode (5) deposited in contact with at least one portion of the intermediate layer (4); the first electrode (3) being with electrical continuity with the first electrical connector (21) and the second electrode (5) being with electrical continuity with the second electrical connector (22).

The at least one component is a battery.

It is specified that, in the framework of this invention, the term "on" or "above" does not necessarily mean "in contact with". As such, for example, the deposition of a layer on another layer, does not necessarily mean that the two layers are directly in contact with one another but this means that one of the layers covers at least partially the other by being either directly in contact with it, or by being separated from it by a film, or another layer or another element. The cover placed on the support therefore does not necessarily imply a contact between these two elements; on the contrary, a space is preferably preserved, by forming a cavity.

Figure 2:
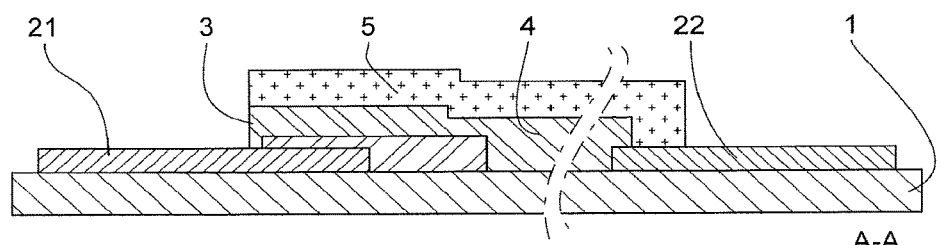
FIG. 2 shows a cross-section view according to the line AA of FIG. 1 of a component on a first face of a support forming, for example, a unit battery.

It is specified that in the framework of this invention, the thickness of a layer is measured according to a direction perpendicular to the surface according to which this layer has its maximum extension. In FIG. 2 for example, the thickness is taken along the vertical.

The invention relates to a method for producing an electrical system, more preferably a microelectronic device. According to the invention, the term microelectronic device means a device comprising elements of micronic and/or nanometric dimensions. The same applies to the term "electronic component". Any system that has for its operation at least one electrical element falls within the scope of the invention.

The method that follows has for pre erred purpose to produce a (micro)electronic device in reference to FIGS. 1 to 11. The term substrate preferentially means a chip or a plate (more commonly referred to as a "wafer") comprising at least one chip.

In the description that follows, the term host substrate or receiving substrate refers to the support 1 and/or to the cover 6 whereon the microelectronic component has been arranged.

This invention proposes an encapsulation solution for devices that are sensitive to air based on the principle of a sealed and hermetic cavity obtained by cover transfer that overcomes the disadvantages of prior art. In particular, the encapsulation solution proposed in this invention authorizes an easy access to the output pads of the devices through the production of vias opening into the cover, advantageously without altering the seal and the hermeticity of the encapsulation solution. Advantageously, one of the main advantages of such a solution resides in its compatibility with the methods of assembly that make it possible to vertically connect one or several devices. As such, this invention allows for high-performance encapsulation with an encumbrances that is geometrically adapted to the size of the component, while still facilitating the steps of integrating and of assembling.

One of the potential applications of this technique relates to the encapsulation and the assembly of devices, carried out using thin layer substrates. More precisely, the invention has for object the supply of a solution for stacking several components while still guaranteeing hermeticity. In particular, one of the major applications of the principle of this invention concerns the integration in three dimensions or the integration 3D of components carried out on transparent supports and encapsulated by transparent covers. In this case, the covers used constitute supports for the production of electronic components which can be identical or different to the component embedded by the support forming the receiving substrate. By way of example, the encapsulation cover can be a support for the production of components, for example of micro-batteries, of electrochromic devices, of photovoltaic cells or any other microelectronic, optronic or electromechanical device. As such, this approach can be used for the production of systems for recovering and for storing energy. Generally, the methods of 3D assembly make it possible to vertically connect one or several devices located on one or several levels in order to provide a response to the problems of miniaturization, of densification of the integration and of reduction in the manufacturing costs. The approach adopted in the state of the art consists, most often, in stacking several components by using techniques for gluing a series of unit chips. The assemblies obtained have several limiting disadvantages such as the encumbrance of the "packaging" with respect to the active layers, the complexity of the interconnections or the absence of a lateral seal. A disadvantage is generally the lack of a seal with respect to the external environment.

The method of encapsulation proposed in the framework of this invention is based on the burying of the microelectronic device containing output pads in a cavity defined on one side by a sealing seam and on the other side by an added cover with one or several through-passages. Such a cavity is geometrically delimited by the active substrate, the encapsulation cover as well as the sealing seam that independently surrounds the microelectronic device of its contact pads which are located facing passages created in the encapsulation cover. Advantageously, the sealing seam is formed from an electrically insulating material.

Another object of an embodiment of this invention is to provide access openings to the electrical connectors on the support containing the microelectronic component. In terms of the method for implementing, the sealing of the encapsulation cover can be carried out under a controlled inert atmosphere in order to ensure an insulation of the microelectronic device with respect to the outside environment as such guaranteeing an integrity and a prolonged service life.

The description given in the rest of this document shall refer to a particular device of a lithium micro-battery, with the understanding that this example is given for the purposes of illustration and is not limiting. It can be transposed to any electronic, optical, optoelectronic, micromechanical or other component. In order to show the principles of this invention better, we shall use as a basis this example comprising at least one component of the lithium micro-battery type carried out on a thin glass substrate, for example of a thickness of 50 microns.

According to a preferred but non-limiting embodiment of the invention, the steps of producing an electrical system comprising at least one component 2, for example of the lithium micro-battery type, can be carried out as is shown in FIGS. 1 to 11.

Generally, the component 2 (for example, a micro-battery) is carried out by known techniques of prior art. The dimensions and the thicknesses of the layers that comprise the component 2 and in particular the micro-battery, are given for the purposes of illustration in order to represent the principles of the invention.

FIG. 1 shows a top view of a component 2 of the unit battery type comprising a first electrical connector 21 and a second electrical connector 22. The component 2 is arranged on a support 1. The dimensions of width and of length of the support 1 are represented, respectively, by the values $I_1$ and $L_1$. FIG. 2 shows a cross-section view of a component 2 forming a unit battery. The component comprises a first electrical connector 21, more preferably cathodic and a second electrical connector 22, more preferably anodic. Advantageously, the electrical connectors 21, 22 include a metal material. They are for example formed from a base of titanium, gold, aluminum, platinum, tungsten, or any other metal that can be used as an electrical connector. According to a non-limiting embodiment of the invention, the electrical connectors 21, 22 are of a thickness of 0.5 micron. The electrical connectors 21, 22 are formed on a first face of the support 1. According to a preferred embodiment, the electrical connectors 21, 22 are in direct contact with the support 1. The face of the support 1 where this contact has taken place is more preferably dielectric.

The support 1 can contain a component or a plurality of components 2. According to a preferred embodiment, the support 1 is formed from a material, for example with a glass base for example of the type of the borosilicate family, in particular with a thickness of 50 microns, characterized by a coefficient of thermal expansion (acronym "CTE") at 20° C., of $7.2 \times 10^{-6}$ $K^{-1}$ and a transformation temperature Tg of 557° C.

The component 2 can comprise a stack of layers; with the stack comprising active layers that are more or less sensitive to the air. These sensitive layers comprise a first electrode 3, a second electrode 5 and an intermediate layer 4. Preferably, the first electrode 3 is deposited on the support 1. The intermediate layer 4 is deposited in contact with at least one portion of the first electrode 3. The second electrode 5 is deposited in contact with at least one portion of the intermediate layer 4.

The component 2 can for example have an outer contour with straight edges. Preferably, the stack of layers comprises, on each connector 21, 22, a detaching, for example a withdrawn corner forming an angle of 90°, in such a way as to define a zone of the component where only the connector 21, 22 is exposed. This exposed zone of each connector 21, 22 can have any shape and any location adapted to the desired application. Preferably, this zone is at the periphery of the rest of the electronic component.

During a first step, shown in FIG. 2, the first electrode 3 is formed. According to an advantageous embodiment, the first electrode 3 partially overlaps the first electrical connector 21. In other terms, the first electrode 3 is advantageously carried out in such a way that a first portion is positioned above the first electrical connector 21 and a second portion is positioned directly above the support 1. The first electrode 3 and the electrical connector 21 are advantageously in electrical continuity.

According to an embodiment, the first electrode 2 is an electrode referred to as "positive", comprising a material that good electronic and ionic conductivity, for example chosen from: $TiOS$, $TiS_2$, $LiTiOS$, $LiTiS_2$, $LiCoO_2$, $V_2O_5$, etc. The first electrode 2 has, for example, a thickness of 5 microns.

The intermediate layer 4, forms more preferably an electronic insulator with high ionic conductivity. According to an example, the intermediate layer 4 forms an electrolyte. LiPON is, for example, the most commonly used electrolyte in the micro-battery technology, but there are other materials such as LiPONB, LiSiCON, which are also suitable as an intermediate layer. The intermediate layer 4 comprises, for example, a typical thickness of 2 microns. According to an embodiment, the second electrode 5 is an electrode referred to as negative, of a thickness for example of 2 microns. The second electrode 5 can be comprised exclusively of metal lithium, in the case of a metal lithium battery, or of a knowingly lithiated material, in the case of a lithium ion battery. Metal lithium batteries are extremely sensitive to oxidizing species. Therefore, they require a higher level of encapsulation compared to so-called lithium ion batteries.

According to a non-limiting embodiment of the invention, the total surface of a component 2, for example an individual battery, comprising the electrical connectors 21, 22 is 1 centimeter×1 centimeter and the total thickness is about 10 microns. The surface dimensions of the electrical connectors are, more preferably, identical and given around 1 millimeter×1 millimeter, for example.

Figure 3:
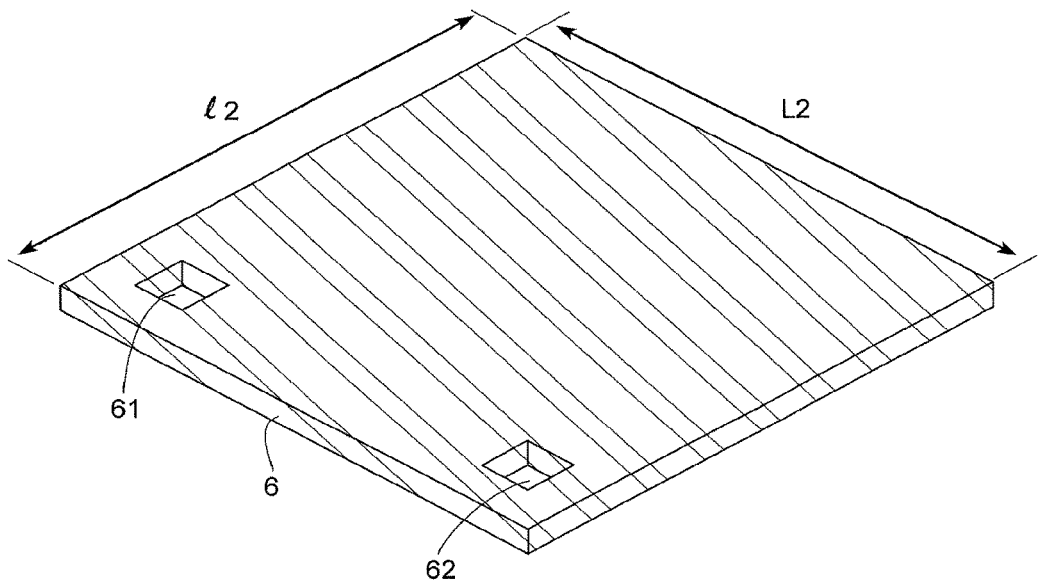
FIG. 3 shows a cover provided with a first passage and with a second passage, according to a dimension in thickness of the cover.

FIG. 3 shows a cover 6 provided with a first passage 61 and with a second passage 62, according to a dimension in thickness of the cover 6. According to a preferred embodiment, the passages 61, 62 of the "vias" type are carried out in the encapsulation covers 6 which will be added onto the support 1 containing at least one component 2. The encapsulation cover 6 is more preferably chosen made of glass, for example of a thickness of 50 microns and/or chosen in the materials already described in reference to the support 1. However, this principle can be widened to other materials of supports 1 and covers 6 characterized by other thicknesses and other optical, thermal or mechanical properties. The encapsulation cover 6 recommended in this embodiment is a glass that is transparent to infrared and/or near infrared radiation. The characteristic values of optical transmission in the wavelengths desired and refractive index are, for example of about 91.7% and 1.523, respectively. The geometrical dimensions of the encapsulation cover 6 diagrammed by the values $I_2$ and $L_2$ of FIG. 3 are more preferably identical to those defined by the component 2 and its electrical connectors 21, 22 with a deviation of the width-length values of ±1%. The encapsulation cover 6 can be a passive substrate without an active layer, a substrate with electrical elements or a substrate with one or several components of the same nature or of a different nature. The predominant criterion in choosing the materials that comprise the cover 6 is dictated by the barrier properties required by the application under consideration. These covers 6 of a thickness preferentially less than 100 microns can be of a metal, ceramic, glass nature or any other material or combinations of materials making it possible to guarantee a sufficient seal with respect to oxidizing species such as for example: water $H_2O$, oxygen $O_2$, or/and nitrogen $N_2$.

According to the application under consideration, other criteria of an optical (transparence and transmittance), thermal, chemical-physical (resistance to corrosion) or mechanical nature can be required. Preferably, the covers 6 are chosen from the wide range of the different families of glasses (borofloats, borosilicates or derivatives thereof) sold by several glassmakers under different names, at thicknesses less than or equal to 100 microns. Preferably, the material of the cover is chosen in coherency with respect to the mechanical and/or thermal properties of the material of the support. It can more preferably be arranged that the CTE of the material of the cover and that of the support be identical or different from one another by a maximum ratio of 2.

The carrying out of the encapsulation cover 6 is subdivided into two basic steps; the following order is purely for the purposes of information. A first step comprises the carrying out of passages 61, 62 that are preferentially through-passages according to a dimension in thickness of the cover 6, making it possible to access the electrical connectors 21, 22. The dimensions of these passages 61, 62 are defined by the size of the electrical connectors 21, 22 of the microelectronic component located on receiving substrate 1. By using dedicated laser techniques (ablation, filamentation), it is possible to consider the carrying out of through-vias or passages 61, 62 in glass covers 6 of a diameter that caries by a few millimeters to a few microns, over a depth of less than 100 microns. Alternatively, the operations of creating passages 61, 62 can be conducted thanks to chemical abrasion techniques. Advantageously, at least one of the passages 61, 62 is located only facing a connector 21, 22 or a portion of the latter. As such, the passage considered forms an access dedicated to a total or partial portion of the upper surface of the connector.

A second step comprises the deposition of a sealing seam 7 in a peripheral zone of the component 2. Advantageously, the passages 61, 62 open onto a surface that represents half of the surface that is not covered by other layers of each one of the two electrical connectors 21, 22. According to a preferred embodiment, two identical passages 61, 62 located facing electrical connectors 21, 22, for example with a width or diameter of 500 microns, are obtained in the cover 6, after conventional laser ablation operations defined in the state of the art, for example the excimer laser. YAG laser, acronym referring to the use as an amplifier of a yttrium-aluminum doped garnet, etc. The passages 61, 62 can be carried out under different geometrical shapes, for example rectangular (of which square), oval, etc.

The passages provide electrical access without calling into question the encapsulation to be produced. The latter entails a setting into place of the electronic component 2 into a cavity in such a way as to protect it at least partially against the effects of its environment of which humidity. This encapsulation is not necessarily complete; for example a portion of the component 2 in particular on connectors 21, 22 can remain exposed. The encapsulation is more preferably produced by a sealing seam 7 forming at least one wall, more preferably with a closed contour, around at least one portion of the component 2.

According to a particular embodiment, the construction of the sealing seam 7 on encapsulation cover 6 is designed with the purpose of separately surrounding the active layers of the component 2 and the electrical connectors 21, 22. As such, the peripheral sealing seam 7 is arranged, on a first face of the cover 6 intended to be put into contact with a first face of the support 1, with a faculty that makes it possible to create three separate zones diagrammed in FIG. 4. The two first zones are defined by the walls of a first sealing seam 71 that delimit the through-passages 61, 62. A portion of space delimited by the upper face of the connector, the cover and the inside lateral wall of the first sealing seam 71 is as such advantageously formed. Preferably, the sealing seam 71 extends only around the passage that corresponds to it. Typically, a sealing seam here means a three-dimensional object that has a longitudinal dimension that corresponds to the thickened lines that can be seen in the figures and a thickness oriented according to the thickness of the support and a width oriented perpendicularly to the two preceding dimensions and inscribed within a much lower dimensional scale (for example at least ten times) than that of the longitudinal dimension. As such, the first and/or the second seam are extended patterns. Preferably, the first seam 71 is carried out in the immediate vicinity of the mouth of the passage 61, 62, on the lower face of the cover 6. For example, the first seam can carry out a closed contour around the passage with this contour defining an inner surface of which the surface area is not greater than eight times the surface area of the section of the passage and advantageously not greater than four times the latter.

The third zone is the result of the framing of the active portions of the component 2 by a second sealing seam 72. The first seam 71 and the second seam 72 form at least partially the sealing seam 7. The three zones can be carried out in a single technological step or in several steps. However, the height of the walls of the first seam 71 and of the second seam 72, in other words the thickness of the sealing seam 7, characteristics of the three zones, are more preferably identical. The representation in FIG. 4 is diagrammatical and shows in thick lines the location of the formation of the portions of the seam that are not yet irradiated.

According to an embodiment of the invention, the thickness of the sealing seam 7 is advantageously chosen in such a way as to create a cavity 9 between the support 1 and the encapsulation cover 6 required for correct electrical functionality without altering the charge/discharge cycles of the component 2, in this case of a battery. These cycles, corresponding to an insertion/removal phenomenon of the lithium between the first and second electrodes 2, 5, resulting generally in volume expansion phenomena of said electrodes 2, 5. It is therefore useful to clear a cavity 9 for a free vertical movement of the electrodes 2, 5. The height of such a cavity 9 is defined by the difference between the thickness of the sealing seam 7 and that of the stack of the layers of the component 2, forming the battery. Typically, the minimum value of this height is fixed around 5% of the value of the total thickness of the component 2. The planar dimensions of the walls of the sealing seam 7, defining the three zones are optimized according to the size of the elements to be protected so as to effectively reduce the encumbrance of the "packaging" in relation to the total surface of the microelectronic device. As such, the width of the sealing seam 7 can be reduced to 100 microns without altering the sealing and mechanical resistance properties of said sealing seam 7. On the other hand, the inside diameter of the zones separating the walls from the sealing seams 7, 71, 72 is at least equal to that of the passages 61, 62. On the other hand, the length of the sealing seam 7 is identical to that defined by the dimensions of the component 2 and of the encapsulation cover 6. These atypical dimensions of the sealing seam 7, recommended in these embodiments, can be adjusted according to the applications. Advantageously, the cover does not come into contact with the support or with elements carried by the latter. In particular, it is preferred that the connectors 21, 22 not be in contact with the cover 6 after assembly.

The separation partitions defining the three zones constitute the sealing seam 7. These are in fact sealed pillars for the mechanical consolidation if the stack formed by the encapsulation cover 6 and the host substrate 1. Firstly, due to their barrier properties, these partitions guarantee a lateral encapsulation of the micro-battery along its periphery as well as the passages 61, 62 that authorize access to the electrical connectors 21, 22. Through its geometrical distribution in the various zones of the encapsulation cover 6, the sealing seam 7 covers, according to a preferred embodiment, the entire peripheral perimeter defined by the dimensions of the component 2 and its electrical connectors 21, 22. Such an arrangement of the sealing seam 7 contributes effectively to an increased mechanical robustness of the cover 7 support 1 assembly, by overcoming the presence of weak zones on connectors 21, 22. In the case of FIG. 4, the seam, not yet irradiated, is presented in the form of thick lines. The dimensions in height are here diagrammed with a concern for simplification of the comprehension and are not representative of reality.

In a case not shown, the seam 72 runs along the periphery of the entire component 2, by being in contact, in its entirety with the first face of the component 2. The seams 71 are always located on connectors 21, 22, and more precisely around passages 61, 62 (or 63, 64 for the support 1) in order to form a solid and continuous wall next to the passages, from the cover 6. As in the preceding case, this seam 71 laterally delimits a space opening onto passages 61, 62, 63, 64. This space is electrically insulated with respect to the rest of the component 2 and the filling thereof with a conductive material, which shall be described hereinafter, does not have any negative consequence. Before the step of filling, this space is empty and nothing opposes the filling. In addition this wall coming from the seam 71 forms an encapsulation element of the component 2 around the passage under consideration. In the case of FIG. 4b is, the seam 71 forms a closed contour around passages 61, 62. The seam 72 is located around a major portion of a zone intended to be facing the component to be encapsulated. The seal 72 is here a contour that is not closed that joins the seams 71. The seal 72 then comprises a straight section between two points of the two seals 71, and a "U" section joining two other points of the two seals 71.

The formation of the peripheral seam 7 can be carried out in a single step by deposition techniques by preferably using a glass paste. In addition to its intrinsic barrier properties with regards to oxidizing species (WVTR and OTR values $\sim 10^{-6}$ gm$^{-2}$ j$^{-1}$), this product has more preferably thermal characteristics (CTE at 20° C. of about $7.7 \times 10^{-6}$·K$^{-1}$) very close to those of the support 1 and of the encapsulation cover 6 (CTE at 20° C. of about $7.2 \times 10^{-6}$ K$^{-1}$). Furthermore, this product has the advantage of a sealing ability in relatively short times under laser irradiation (60 seconds according to an embodiment), as such limiting the risks of propagation of heat during the step of sealing.

Alternatively to the techniques of local deposition for release or screen printing, the glass paste used can be deposited over the entire surface of the encapsulation cover 6 by using techniques of the state of the art such as deposition via spin coating or by coating. After the step of thermal vitrification, the glass paste is mechanically frozen on the encapsulation cover 6. On the other hand, the laser irradiation required for the carrying out of the sealing seam 7 is carried out locally on dimensions equivalent to those defined hereinabove. In this case, the cavity 9, not filled, of the basic configuration is replaced with a polymer that is favorable to the mechanical stresses of the two electrodes 2, 5. Advantageously, this approach can be considered as a mechanical consolidation of the assembly for the use of support 1 or of ultrathin encapsulation covers 6 (less than 25 microns).

This second option also allows for the product on of the sealing seam 7 by deposition of the sealing layer directly on the first face of the substrate 1 containing the active layers of the component 2 and the electrical connectors 21, 22. This option has the advantage of simplifying the assembly methods in the case where the encapsulation cover 6 comprises one or several active components 2.

The filling polymer can be removed on passages before the step of solidification, in particular via laser.

After the step of deposition of the glass paste by the technique of releasing, the sealing seam 7 is, for example, obtained at the end of the method of vitrification for example at a temperature of 150° C. for 30 minutes as such allowing for the degassing of the organic products (10 to 15% in volume) initially present in the glass paste. By way of an application example, the thickness and the width of the sealing seam 7 deposited on the encapsulation cover 6, for example made of glass of the D263T type, are, respectively, about 50 microns and 100 microns. The inner diameter or the largest width of the zones that surround the passages 61, 62 is, for example, 500 microns and the perimeter of the zone that encompasses the active layers of the component 2 is, for example, of about 4 centimeters. It is this final step that makes it possible to carry out a support 1-cover 6 assembly by a laser sealing of the seam 7.

The method of welding by laser is based on a localized radiation that can be applied on one of the sides of the sealing seam 7 in contact with the cover 6 and the active substrate 1. This generates a fusion of the material, for example of the glass paste, under the effect of the laser heating leading to a gluing of the cover 6 onto the support 1. The cover 6 and/or the support 1 are preferably transparent (in particular more than 90% transmission) in the range of the wavelengths corresponding to the laser chosen.

The sealing by welding of a glass frit is a simple and robust method that offers a preferred solution. One of the main advantages of this technique is linked to its facility of implementation independently to the flatness of the surfaces to be glued due to its high wetting capacities. Generally, the seal of the sealing seams 7 is a criterion sought for the encapsulation solution by cover 6 transfer. In order to reduce the mechanical stress problems, it is desirable to use materials with CTE values that are as close as possible to one another with variations of less than 10% for the cover 6, the support 1 and the seal 7.

Figure 5:
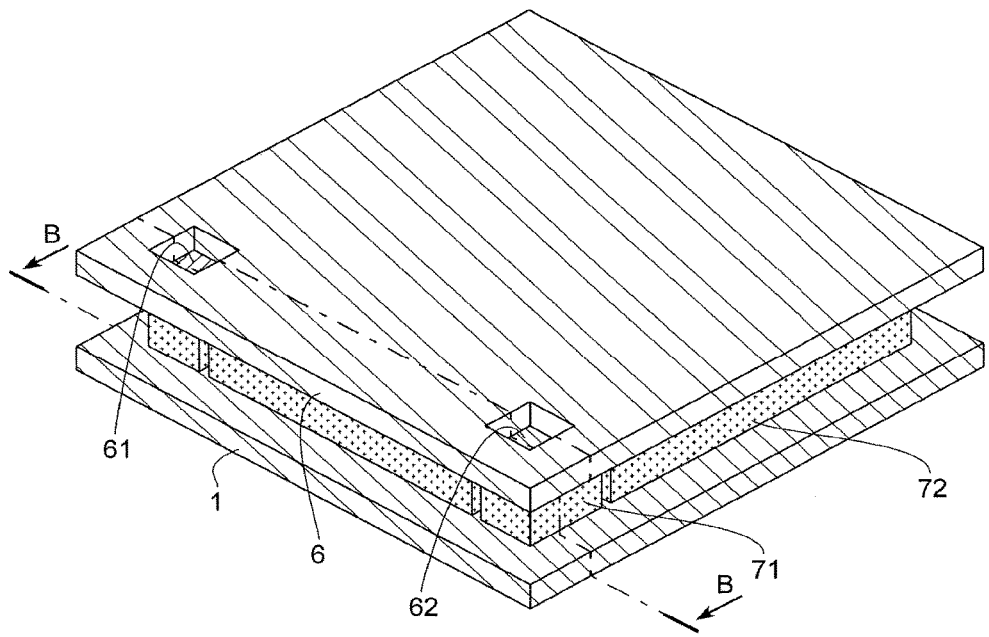
FIG. 5 shows, in the case of FIG. 4, the setting in place of the cover, said cover being positioned on the component in such a way that the sealing seam joins the first face of the cover and the component formed on the first face of the support.

According to an embodiment shown in FIG. 5, the encapsulation cover 6 is provided with openings 61, 62 and the sealing seam 7 is positioned, by using microelectronic manipulation equipment ("pick and place"), over the support 1 containing the active layers of the component 2 and the electrical connectors 21, 22. This positioning is carried out in such a way as to have the face of the cover 6 containing the three zones correspond with the first face (or active face) of the support 1. Advantageously, the passages 61, 62 are used to guarantee a precise alignment of the encapsulation cover 6 in relation to support 1. As such, the passages 61, 62 are directly facing the electrical connectors 21, 22. Par application of a force of pressure for example of about 1 Newton, the sealing seam 7 is more preferably in direct contact with the support 1. After the step of compression, the substrate 1-cover 6 assembly is exposed to laser radiation using a fiber of which the characteristic wavelength is located in the near infrared range, typically at 940 nanometers. In practice, a laser illumination with a power of 80 Watts for 60 seconds and a displacement speed of 2 mm/s is sufficient for generating the abrasion of the sealing seam 7, making it possible to permanently seal the encapsulation cover 6 and the support 1.

Figure 6:
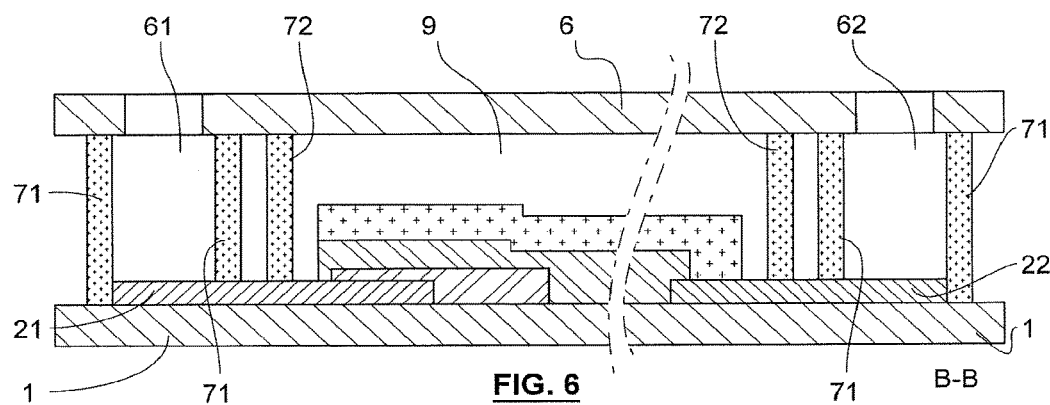
FIG. 6 shows a cross-section view according to the line BB of FIG. 5 of an encapsulated component in a sealed cavity delimited by the first face of the support, the first face of the cover and the sealing seam.

FIG. 6 shows a cross-section view of a component 2 housed in a cavity 9 delimited by the first face of the support 1, the first face of the cover 6 and the sealing seam 7. The assemblage constituted by the component 2 and the cover 6 is a mechanical solid assembly with easy access to the electrical connectors 21, 22. The active layers of the component 2 are located at least partially in a sealed cavity 9 defined by a joint between the cover 6 and the support 1. Optionally, the cavity 9 generated by the sealing of the encapsulation cover 6 on the support 1 comprising the component 2 can be controlled in atmosphere, by carrying out methods of sealing under inert gas (such as argon) or in a vacuum.

According to the invention, the sealing seam 7 surrounds and delimits the active portions of the component 2 independently of the electrical connectors 21, 22 which are surrounded separately. The zones created by the walls delimiting the electrical connectors 21, 22 are located advantageously facing passages 61, 62 made in the encapsulation cover 6. Therefore, it is possible to access the electrical connectors 21, 22 through the passages 61, 62, without altering the seal of the component with regards to the external environment. In addition, this solution guarantees increased mechanical robustness for the assembly constituted by the microelectronic device and its packaging. This major advantage has application in the methods of three-dimensional assembly of microelectronic components in general and more particularly the components carried out using ultrathin substrates (thickness less than 50 microns) requiring the use of ultrathin encapsulation covers 6. Indeed, in a standard method of prior art, the placing facing of an active substrate 1 with its encapsulation cover 6 creates a zone of mechanical weakness that can be diagrammed by a cap on portions defined by the electrical connectors 21, 22. Advantageously, the filling of the passages 61, 62 with a conductive material is better channeled in the presence of walls forming a burial well of the conductive material.

Figure 7:
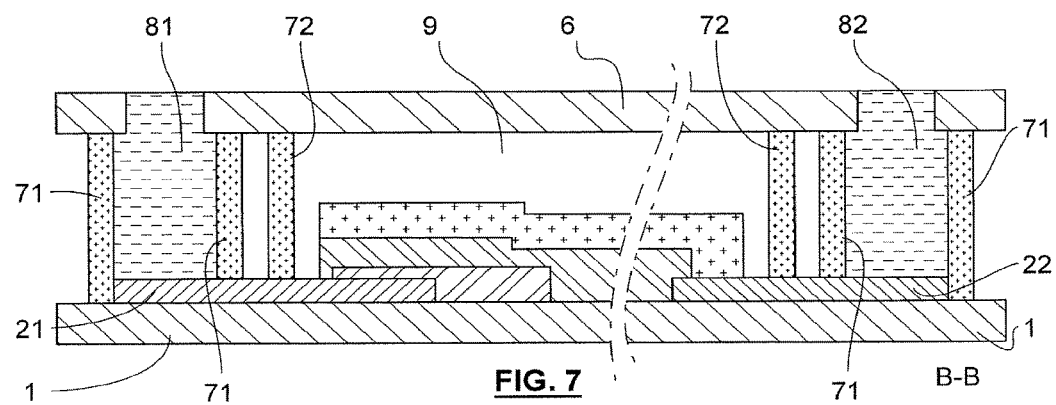
FIG. 7 shows a cross-section view of the step of filling passages of the cover with a conductive material.

FIG. 7 shows the step of filling passages 61, 62 with a conductive material that as such makes it possible to offset the electrical contacts or connectors 21, 22 in relation to the various active layers of the component 2. The filling can, for example, be completed by using suitable techniques defined in the state of the art: filling with a conductive liquid polymer, lamination of a conductive film or electrodeposition of conductive layers. Generally, it is advantageous to use a material in liquid state during the filling per se than to solidify this material once it has filled the space defined by the sealing seam 7. Preferentially, this step can be carried out by using a conductive liquid polymer solution followed by an adequate heat treatment. Advantageously, the presence of the walls of the sealing seam 7 facilitate the channeling and the flow of the liquid polymers. By way of an example that is illustrative but not limiting of the invention, the conductive polymers make it possible to accomplish the functionality of filling the accesses obtained by the superimposing of the passages 61, 62 on the walls after a heat treatment at 150° C. for a duration of 15 minutes.

The filling of the invention does not impose that the conductive material fully fill the space between the seam 71 and the passage under consideration, although this is preferred. Furthermore, different filling materials can be used to fill different passages.

Figure 8:
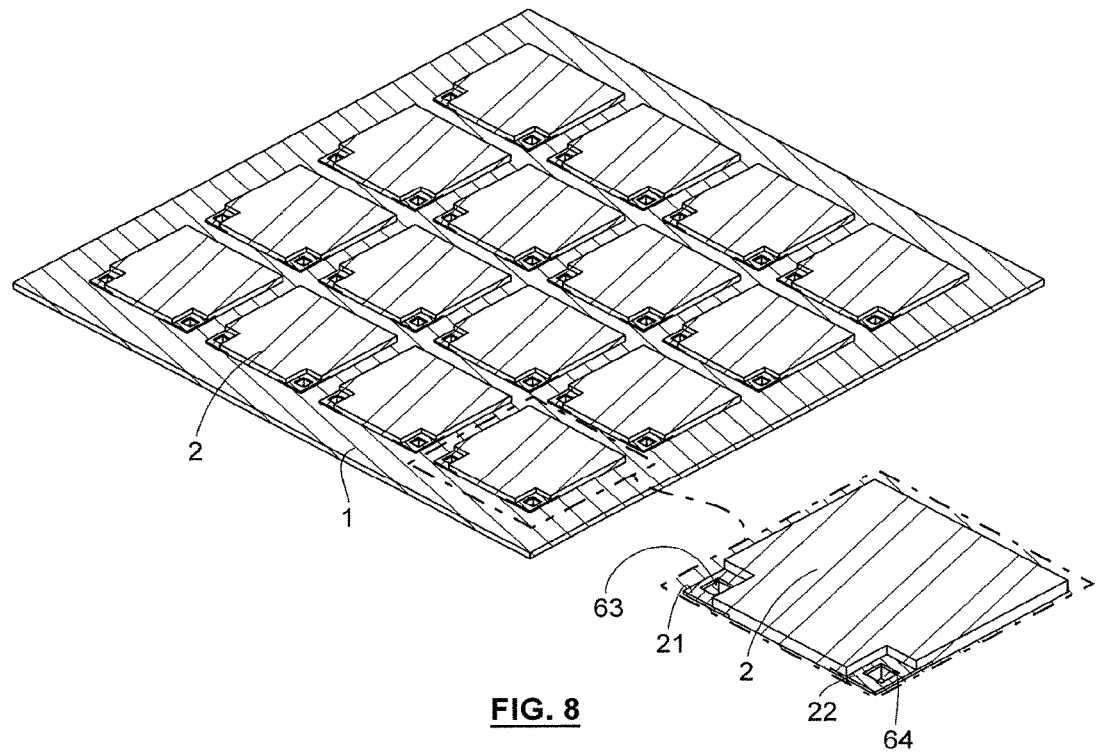
FIG. 8 shows a particular embodiment where the component, for example a battery, comprises two openings that pass through the electrical connectors 21, 22 of the component 2.

FIG. 8 shows a particular embodiment wherein the component 2, for example a battery, comprises two passages 63, 64 which pass through the electrical connectors 21, 22 of the component 2. The stack of the active layers forming the component 2 is carried out with the same methods mentioned hereinabove. The support 1 is preferentially a transparent material, for example made of glass. Each component 2 has two passages 63, 64 that pass through the support 1, created by the techniques described hereinabove, on electrical connectors 21, 22. According to an embodiment, these selective passages 63, 64 are carried out after the forming of the stack of the layers forming the component 2. This allows for a tapping access from underneath the support 1. FIG. 8 furthermore shows that the support 1 can be a wafer used as a support, for the manufacture, of a plurality of electronic components. The method of the invention can therefore be mutualized for several components.

Figure 9:
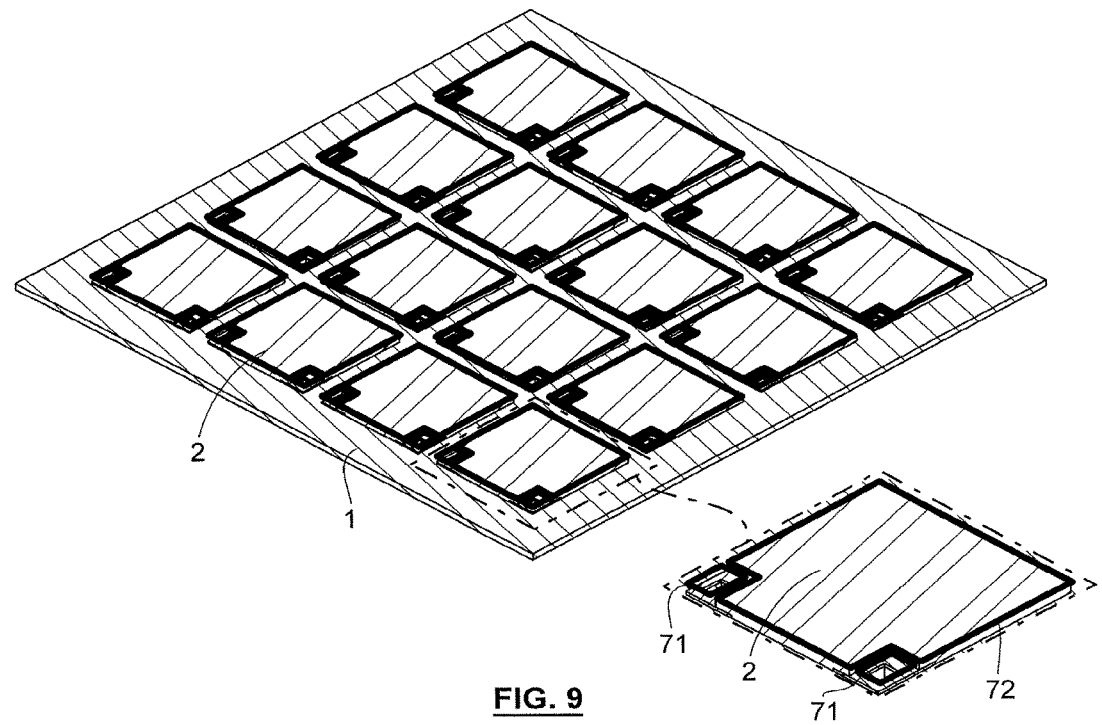
FIG. 9 shows a particular embodiment wherein the sealing seam is formed on the first face of the support.

FIG. 9 shows a particular embodiment wherein the sealing seam 7 is formed on the first face of the support 1. The sealing seam 7 is formed directly on the support 1 containing the component 2. The zones, identified by the walls of the sealing seam 7, surround the openings 63, 64 carried out on electrical connectors 21, 22. One of the zones is defined by the active layers of the component 2 surrounded by the walls of the sealing seam 7.

Figure 10:
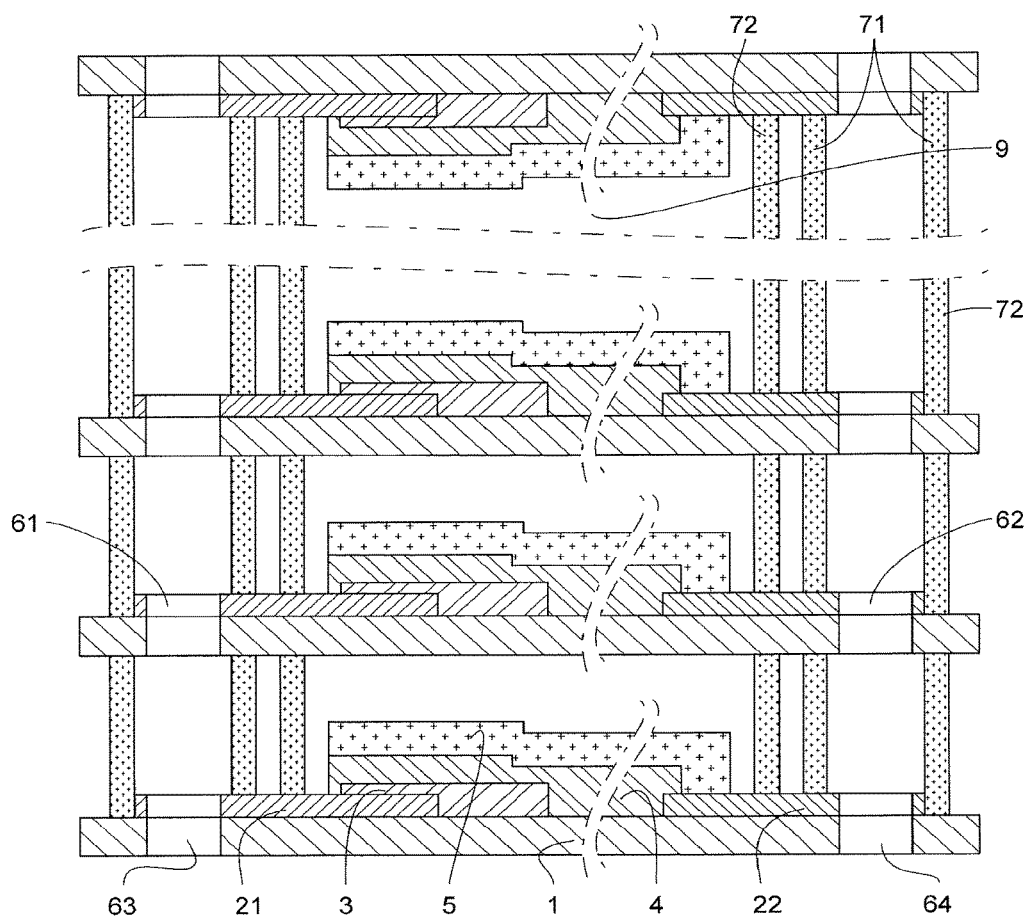
FIG. 10 shows a cross-section view of a particular embodiment comprising a plurality of stacked devices.

FIG. 10 shows a cross-section view of a particular embodiment comprising a plurality of stacked devices. The devices, and in particular the components 2 of each one of the devices, can be stacked on one another, by respecting an embodiment according to a serial mounting or a parallel mounting. Contrary to the other components that comprise the core of the assembly, the component 2 of the last stage that makes it possible to close the assembly is mounted head to head. In other words, the component 2 of the last stage is mounted on the first face of the cover 6 which forms in this case the support of the component in question; with this component 2 facing the component 2 mounted on the first face of the support 1. It is possible to replace the device of the last stage with a simple cover 6. The application of a suitable irradiation laser makes it possible to seal, in a sustainable manner, the various devices, creating as such a sealed a robust assembly with an integration that offers a reduction in the encumbrance of the packaging. The cover 6 can therefore itself double as a support for one or several components 2.

Figure 11:
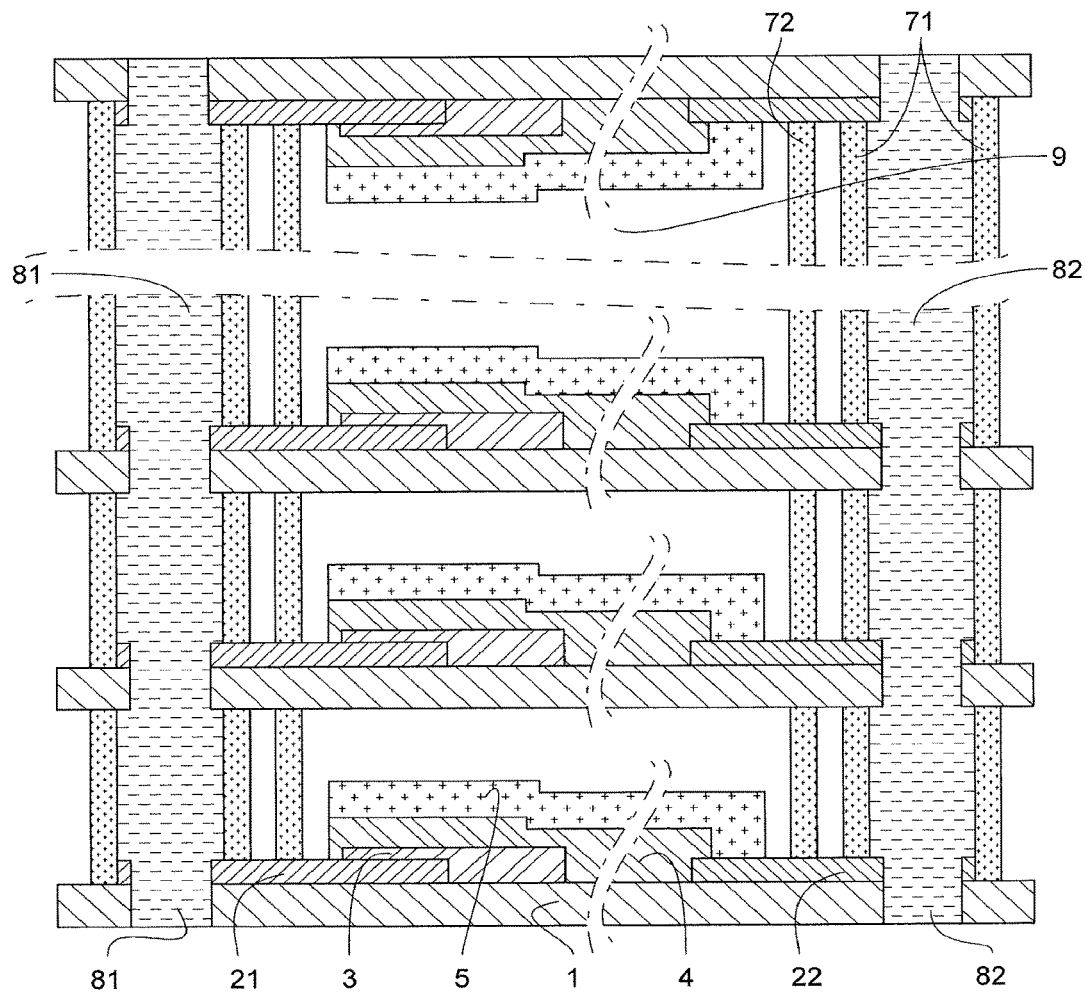
FIG. 11 shows a cross-section view of a particular embodiment wherein the devices are stacked and cooperate in order to form through-vias.

FIG. 11 shows a cross-section view of a particular embodiment wherein the devices are stacked and cooperate in order to form through-vias. The filling of the vias can be carried out in a single step using a conductive material, for example a conductive glue. The presence of the walls of the sealing seam 7 allow for a better control of the step of filling. Indeed, the volume of the passages 61, 62 is entirely filled in with the conductive material. This makes it possible to reinforce and to optimize the contact surface between the conductive material and the electrical connectors 21, 22, making it possible as such to improve the quality of the tappings of electrical contacts 81, 82, and allowing for a transfer of the tappings towards the outside of the assembly.

The invention is not limited to the embodiments described hereinabove, but extends to all the embodiments that are in accordance with its idea. The alternatives or options described in this part stem directly from the description of the preceding technological steps. They are valid for the illustrative applications such as micro-batteries but can be transposed to other microelectronic components. Unless mentioned otherwise, the steps that describe the examples presented in each part are based on the same principles mentioned beforehand.

The passages 63, 64 that allow for access to the electrical connectors, can be carried out in the receiving substrate 1 on electrical connectors 21, 22 by using techniques similar to those described hereinabove. This option offers the advantage, after filling vias or passages 61, 62, of providing a second access to the electrical connectors 21, 22, alternative to the access on the side of the encapsulation cover 6.

The invention claimed is:

1. A method for producing an electrical system comprising at least one device that comprises a support carrying on a first face at least one electronic component provided with at least one electrical connector, with the method comprising:
    setting in place a cover above the component, said cover comprising at least one passage according to a dimension in thickness of the cover in such a way as to form an access to the at least one electrical connector,
    forming a sealing seam in such a way that the component is at least partially located in a cavity delimited by the first face of the support, the first face of the cover and the sealing seam,
    with the method comprising filling with an electrically conductive material the at least one passage of the cover in such a way as to establish an electrical continuity between the electrically conductive material and the at least one electrical connector, formant a tapping, the sealing seam being dielectric, and wherein the sealing seam comprises a first seam; the first seam having a longitudinal dimension forming a closed contour around the at least one passage.

2. The method according to claim 1, wherein the at least one passage of the cover is carried out facing the at least one electrical connector.

3. The method according to claim 1, wherein the first seam is carried out in such a way as to form a solid and continuous wall next to the at least one passage.

4. The method according to claim 1, wherein the filling is configured to entirely fill the space between the first seam and the at least one passage.

5. The method according to claim 1, wherein the first sealing seam is configured to insulate at least one portion of the upper surface of the electrical connector relatively to the rest of the at least one electronic component.

6. The method according to claim 1, wherein, prior to the filling with an electrically conductive material, it is carried out in the support the at least one passage according to a dimension in thickness of said support in such a way that the at least one passage passes through the at least one electrical connector.

7. The method according to the claim 6, wherein the filling is configured in such a way that the conductive material passes through the support through the at least one passage in such a way as to be exposed on a second face of the support, opposite the first face.

8. The method according to claim 1, wherein the filling comprises one from among: an electrodeposition of conductive layers, a lamination of a conductive film, a filling with a polymer in liquid phase.

9. The method according to claim 1, wherein the setting in place of the cover is configured to preserve at least one second access to at least one second electrical connector; said cover comprising at least one second passage according to a dimension in thickness of the cover, and wherein the filling with a conductive material is carried out in such a way as to fill at least the first passage forming a first tapping with electrical continuity with the first electrical connector and the second passage forming a second tapping with electrical continuity with the second electrical connector.

10. The method according to claim 1, wherein the cover comprises at least one electronic component on at least one of its faces and wherein the at least one passage of the cover passes through the at least one electrical connector of the component in such a way that the filling is configured in such a way as to establish an electrical continuity between the at least one electrical connector of an electronic component carried by the support and the at least one electrical connector of the electronic component carried by the cover.

11. The method according to claim 1, wherein several devices are superimposed according to the dimension in thickness, the cover of a first device acting as a support for a second device, in such a way that, during the filling, the at least one electrical connector of each one of the devices is placed in electrical continuity between them by the conductive material in such a way as to form a tapping common to said devices.

12. The method according to claim 11, wherein at least one passage of each device is facing a passage of each one of the other devices.

13. The method according to claim 11, wherein the sealing seam comprises a second seam, the second seam forming a contour around at least one portion of the component.

14. An electrical system comprising at least one device that comprises on a first face at least one electronic component provided with at least one electrical connector, with the system comprising:
  a cover positioned above the component; said cover comprising at least one passage according to a dimension in thickness of the cover in such a way as to form an access to the at least one electrical connector,
  a sealing seam in such a way that the component is at least partially located in a cavity delimited by the first face of the support, the first face of the cover and the sealing seam,
  with the system comprising an electrically conductive material filling the at least one passage of the cover in such a way as to establish an electrical continuity between the electrically conductive material and the at least one electrical connector, formant a tapping, the sealing seam being dielectric, and wherein the sealing seam comprises a first seam; the first seam having a longitudinal dimension forming a closed contour around the at least one passage.

15. The system according to claim 14, wherein the at least one passage of the cover is facing at least one electrical connector.

16. The system according to claim 14, wherein the first seam is a solid and continuous wall next to the at least one passage.

17. The system according to claim 14, wherein the space between the first seam and the at least one passage is entirely filled with the electrically conductive material.

18. The system according to claim 14, wherein the first sealing seam is configured to insulate at least one portion of the upper surface of the electrical connector relatively to the rest of the at least one electronic component.

19. The system according to claim 14, wherein the support comprises at least one passage according to a dimension in thickness of said support in such a way that the at least one passage passes through the at least one electrical connector.

20. The system according to claim 14, wherein the conductive material passes through the support through the at least one passage in such a way as to be exposed on a second face of the support, opposite the first face.

21. The system according to claim 14, wherein the cover comprises at least one electronic component on at least one of its faces and wherein the at least one passage of the cover passes through the at least one electrical connector of the component in such a way as to establish an electrical continuity between the at least one electrical connector du support and the at least one electrical connector of the cover.

22. The system according to claim 14, comprising several devices being superimposed according to the dimension in thickness; the cover of a first device forming the support of a second device, with each one of the devices comprising a passage in such a way that, the at least one electrical connector of each one of the devices is placed into electrical continuity by the conductive material forming a tapping of the system common to said devices.

23. The system according to claim 14, wherein the sealing seam comprises a first seam; the first seam forming a closed contour around the at least one passage.

24. The system according to claim 14, wherein the sealing seam comprises a second seam; the second seam forming a contour of all or a portion of the component, with one portion of the at least one electrical connector not being surrounded by said second seam.

25. The system according to claim 14, wherein the at least one component is a battery.

* * * * *